US006642637B1

(12) United States Patent
Spallas et al.

(10) Patent No.: US 6,642,637 B1
(45) Date of Patent: Nov. 4, 2003

(54) PARALLEL PLATE ELECTRON MULTIPLIER

(75) Inventors: James P Spallas, Dublin, CA (US); Stuart L Friedman, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/537,963

(22) Filed: Mar. 28, 2000

(51) Int. Cl.$^7$ ............................................. H01J 43/00
(52) U.S. Cl. ..................... 313/103 R; 313/528; 313/530
(58) Field of Search ............................. 313/103 R, 528, 313/530, 532, 537, 541, 103 CM, 103; 250/310, 397

(56) References Cited

U.S. PATENT DOCUMENTS

| | | | |
|---|---|---|---|
| 3,675,063 A | 7/1972 | Spindt et al. | 313/104 |
| 4,086,487 A | 4/1978 | Johnson | 250/207 |
| 4,731,559 A | * 3/1988 | Eschard | 313/533 |
| 5,378,960 A | 1/1995 | Tasker et al. | 313/103 |
| 5,619,091 A | 4/1997 | Anderson et al. | 313/103 |
| 5,656,807 A | 8/1997 | Packard | 250/214 |
| 5,986,387 A | * 11/1999 | Niigaki et al. | 313/103 R |
| 6,130,429 A | * 10/2000 | Ambe et al. | 250/310 |
| 6,160,345 A | * 12/2000 | Tanaka et al. | 313/489 |

FOREIGN PATENT DOCUMENTS

JP          10-144251    *  5/1998   ............ H01J/43/24

OTHER PUBLICATIONS

"Development of Parallel Plate Channel Multipliers for Use in Electron Spectroscopy" by Ö. Nilsson et al., *Nucl. Instr. and Methods*, vol. 84 (2), 1970, pp. 301–306.

"Steady Operation of Plane–Parallel Channel Electron Multiplier with Parallel Electric Field," by K. Oba et al., *Electronics and Comm. in Japan*, vol. 53–B, No. 6, 1970, pp. 92–100.

"Steady Operation of Channel Electron Multiplier with Inclined Electric Field," by K. Oba et al., *Electronics and Comm. in Japan*, vol. 53–B, No. 6, 1970, pp. 101–109.

"Channel Electron Multiplier Operation in the Continuous Current Mode" by J. E. Rowe et al., *Rev. Sci. Instr.*, vol. 42, No. 11, Nov. 1971, pp. 1733–1734.

"Pressure Dependence of Gain and Background for Parallel Plate Channel Multipliers" by Ö. Nilsson et al., *Nucl. Instr. and Methods*, vol. 94 (2), 1971, pp. 311–313.

"A Parallel Plate Continuous Dynode Electron Multiplier with Carbon as Dynode Materials" by K. Feser, *Rev. Sci. Instr.*, vol. 42, No. 6, Jun. 1971, pp. 888–889.

"Oxidic Semiconducting Glass Continuous Dynode Electron Multipliers" by J. T. Kerr et al., *J. Non–Crystalline Sol.*, vol. 5, 1971, pp. 306–312.

(List continued on next page.)

*Primary Examiner*—Vip Patel
*Assistant Examiner*—Ken A Berck
(74) *Attorney, Agent, or Firm*—Michael B. Einschlag

(57) ABSTRACT

An electron multiplier having an access for allowing a beam to pass is presented. The electron multiplier collects particles traveling back along the beam and is capable of collecting the particles arbitrarily close to the beam. The electron multiplier includes at least two plates having secondary electron emitting surfaces, the at least two plates being separated by a small distance. The electron multiplier has a beam access through the at least two plates. Particles enter the electron multiplier in a direction opposite that of propagation of the beam and impact a secondary electron emitting surface, thereby being captured between the top plate and the bottom plate. In some embodiments of the invention, the electron multiplier is segmented so that azimuthal distributions of the particles can be determined. In some embodiments, the electron multiplier includes a stack of electron emitting surfaces arranged so that an angular distribution of the particles can be determined.

16 Claims, 7 Drawing Sheets

OTHER PUBLICATIONS

"Parallel–Plate Electron Multipliers" by P. A. Tove et al., *IEEE Trans. Nuc. Sci.,* vol. NS–19, No. 3, Jun. 1972, pp. 85–94.

"Preparation and Characteristics of a Channel Electron Multiplier" by H. Becker, *Rev. Sci. Instr.,* vol. 43, No. 11, Nov. 1972, pp. 1587–1589.

"Dependence of Gain on Plate Separation in a Parallel Plate Channel Multiplier" by L. P. Andersson et al., *Nucl. Instr. and* Methods, vol. 100 (3), 1972, pp. 539–540.

"Effects of Lateral Displacement of the Front Edges in a Parallel Plate Channel Multiplier," by L. P. Andersson et al., et al., *Nucl. Instr. and* Methods, vol. 114 (2), 1974, pp. 233–236.

"Pulse Shape in a Parallel Plate Electron Multiplier Free from Ion Feedback" by S. Berg et al., *Nucl. Instr. and* Methods, vol. 114 (2), 1974, pp. 245–247.

"The parallel–plate electron multiplier" by L. P. Andersson et al., *J. Phys. E: Sci. Instrum.,* vol. 12, 1979, pp. 1015–1022.

"Studies of a parallel–plate electron multiplier" by B. Gelin et al., *J. Phys. E: Sci. Instrum.,* vol. 12, 1979, pp. 311–315.

"Parallel Plate Multichannel Electron Detector with Uniform Response" by B. Gelin, *Physica Scripta,* 24 (2) 1981, pp. 482–486.

"A computer simulation study on electron multiplication of parallel–plate electron multipliers" by S. Suzuki et al., *Rev. Sci. Instr.* vol. 64 (2), Feb. 1993, pp. 436–445.

"Computer simulation study on the detection efficiencies of parallel–plate electron multipliers" by S. Suzuki et al., *Rev. Sci. Instr.,* vol. 66 (66), Jun. 1995, pp. 3483–3487.

* cited by examiner

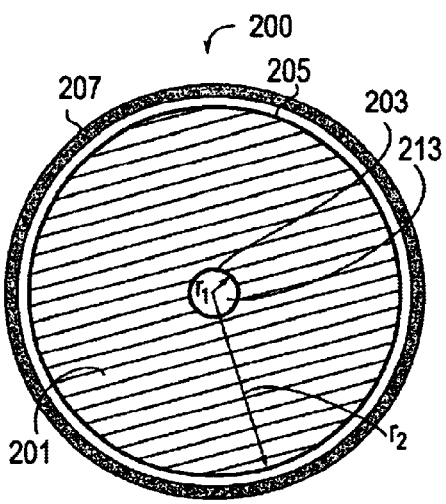
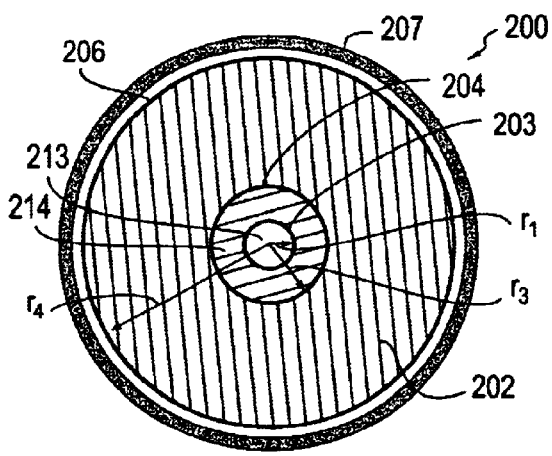
FIG. 3a  FIG. 3b
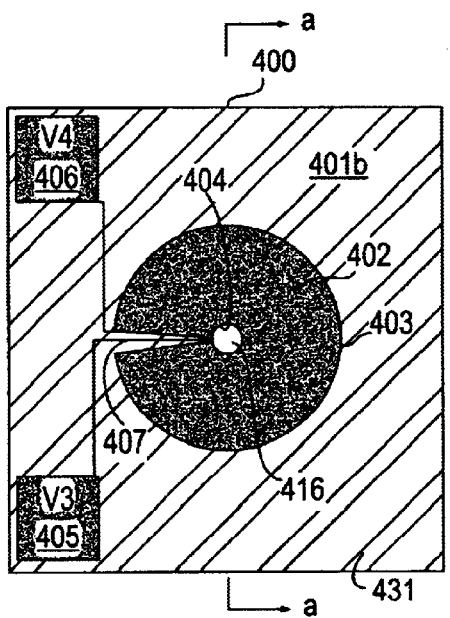
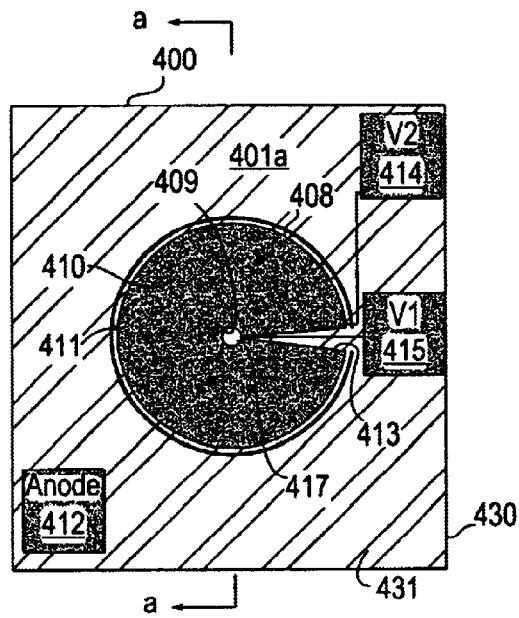
FIG. 4a  FIG. 4b

PARALLEL PLATE ELECTRON MULTIPLIER

BACKGROUND

1. Field of the Invention

This invention relates to electron multiplier devices and, in particular, to electron multiplier devices for detection of particles emitted from a surface as a result of an incident beam impacting the surface.

2. Related Art

Electron multipliers are useful tools for various applications, including the detection of photons, electrons, ions and heavy particles. Such detectors are utilized in various spectroscopic techniques, including Auger electron spectroscopy (AES), x-ray photoelectron spectroscopy, ultraviolet photoelectron spectroscopy, and electron energy loss spectroscopy. Further, electron multipliers may be utilized for detection of secondary and back-scattered electrons in scanning electron microscopes, focused ion-beam tools, or e-beam lithography tools.

In general, electron multipliers have had two configurations, the channeltron multiplier or multi-channel plate multiplier. FIG. 1 shows a parallel plate electron multiplier 100 as described in numerous publications, including S. Suzuki and T. Konno, "A Computer Simulation Study On the Detection Efficiencies of Parallel-Plate Electron Multipliers," Sci. Instrum. 66 (6), p. 3483–87 (June, 1995); and L. P. Andersson, E. Grusell and S. Berg, "The Parallel-Plate Electron Multiplier," J. Phys. E: Sci. Instrum., Vol. 12, p. 1015–22 (1979).

Electron multiplier 100 includes secondary emitting surfaces 101 and 102, deposited on glass plates 111 and 112, respectively, and separated by a spacing 104. A voltage $V_d$ is applied along the length of electron multiplier 100 so that electrons entering at an open end 105 are accelerated along the length of electron multiplier 100 away from open end 105. When the electron collides with one of secondary emitting surfaces 101 and 102, multiple secondary electrons are emitted. The secondary electrons are then accelerated along electron multiplier 100 and themselves may collide with one of secondary emitting surfaces 101 and 102. On each collision of an electron with sufficient kinetic energy with one of emitting surfaces 101 or 102, further electrons are emitted. By repeated collisions of electrons with secondary emitting surfaces 101 and 102, an output pulse containing a very large number of electrons is emitted from electron multiplier 100.

The output pulse is received by collector 103 located on the side of electron multiplier 100 opposite from open end 105. Typically, collector 103 is held at an elevated voltage from the voltage of that end of electron multiplier 100. The output pulse is detected by detection circuitry 106 coupled to collector 103. The gain of electron multiplier 100 depends on the voltage $V_d$ applied across electron multiplier 100, the secondary emission properties of secondary emitting surfaces 101 and 102, and the physical dimensions of electron multiplier 100.

In some electron multipliers such as electron multiplier 100, further voltages are applied to either end of one of secondary emitting surfaces 101 and 102. In such cases, electric fields can be created that are not parallel with the length of electron multiplier 100, thereby enhancing collisions with one of secondary emitting surfaces 101 or 102. Further, collector 103 may be tilted (i.e., the collector surface may not be perpendicular to the surfaces of secondary emitters 101 and 102) in order to further enhance collection of output pulses of electrons and to further supply a component of the electric field not parallel with electron multiplier 100.

Some electron multipliers may be constructed from a glass tube coated with a secondary emitting surface. The resulting multiplier, in principle, operates as described above for parallel plate electron multiplier 100 except that, instead of parallel plate secondary emission surfaces, the secondary emission surface is cylindrical in shape. The tubular channeltron multiplier has the advantage that, because of its tubular nature, it can be shaped into loops and spirals that reduce its overall size without affecting the overall length of the multiplier.

However, each of these multipliers are difficult to use in certain environments. For example, in some instances, such as in lithography or in electron microscopes, it is difficult to detect reflected electrons that are close to an incident electron beam. In some applications, it is desirable to collect electrons from as close to the incident beam as possible. With electron multiplier 100 or the tubular channeltron multiplier, positioning of the opening surface can be difficult.

Therefore, there is a need for an electron multiplier that is easily constructed, of small size, and capable of monitoring the particles close to a beam incident on a surface that emanate from the surface.

According to the present invention, an electron multiplier capable of detecting particles such as, for example, ions, photons, or electrons, traveling close to an incident beam is presented. The electron multiplier includes a top plate and a bottom plate separated by a small gap. Each of the top plate and the bottom plate includes an access through which an incident beam can pass. The accesses of the top plate and the bottom plate are aligned so that the incident beam can pass through the electron multiplier. Particles traveling close to the incident beam, and in a direction opposite that of propagation of the incident beam, can enter the electron multiplier between the top plate and the bottom plate and thereby be detected.

The top and bottom plates each have a secondary electron emitting surface. The secondary electron emitting surface of each of the top and bottom plate emit electrons when the surface is impacted with a particle of sufficient energy. Further, each of the top and bottom plates are resistive so that a current can flow through them. Finally, in most embodiments, the top and bottom plates provide structural support for the secondary emitting surfaces.

In some embodiments, the top and bottom plates can be a single material, for example lead oxide glass, bismuth oxide glass, or iron borate glass. These materials are resistive, provide a secondary emitting surface, and provide structural support. In another embodiment, each of the top and bottom plates can include secondary electron emission layers, for example CVD diamond or an alkali halide, deposited on a resistive layer, for example a metal or low resistance semiconducting layer, deposited on a structural substrate, such as glass.

In one embodiment, the top plate and the bottom plate have an annular geometry. The top secondary emitting surface has an outside radius and an access with an inside radius, and the bottom secondary surface has an outside radius and an access with an inside radius. In another embodiment, the secondary electron emitting surface of the top and bottom plates have annular geometry. The access allows an incident beam to pass through the top plate, with the top secondary emitting surface, and the bottom plate, with the bottom secondary emitting surface, without impacting the electron multiplier.

The references to top and bottom or up and down in this disclosure is with reference to the direction of propagation of an incident beam. Bottom or down refers to a direction closest to a surface on which the incident beam is incident. Top or up refers to the opposite direction from bottom or down.

In most embodiments the outside radius of the top secondary emitting surface and the outside radius of the bottom secondary emitting surface are about the same. In some embodiments the inside radius of the access of the top is less than the inside radius of the access of the bottom secondary emitting surface so that particles (e.g., electrons, ions, or photons) are easily captured into the multiplier.

The access through the annular geometry, through which a beam can pass, has the inside radius of the top secondary emitting surface at the top plate and the inside radius of the bottom secondary emitting surface at the bottom plate of the electron multiplier. In most embodiments, the access is arranged to be at the center of the annular geometry of the electron multiplier.

Voltages applied to electrodes coupled to the top plate and the bottom plate at the inside and outside radiuses of the top secondary emitting surface and the bottom secondary emitting surface provide a radial electric field in the annular electron multiplier. A collector is arranged around the outside radius of the top secondary emitting surface and the bottom secondary emitting surface to collect any burst of electrons emitted from the electron multiplier.

In some embodiments of the invention, the annular collector is segmented. Each segment of the annular collector is coupled to detection electronics in order to measure the angular distribution of particles received into the multiplier. Further, in some embodiments the secondary electron emitting surfaces of the top and bottom plates are segmented in order to enhance the measurements of the azimuthal distribution. Embodiments that segment the secondary electron emitters may have the advantage of reducing distortions of measurements of the angular distribution.

In some embodiments of the invention, the electron multiplier includes several stacked plates, each with secondary electron emitting surfaces, each separated by a small distance. Each of the stacked plates has an access with a different inner radius and are arranged in order of the size of the inner radius. In most embodiments, the plate with the largest inner radius is on the bottom (i.e., closest to the surface on which the incident beam impacts) and the plate with the smallest inner radius is on the top. Plates having inner radiuses of various sizes are arranged accordingly between the top plate and the bottom plate. Embodiments of this type provide the ability to measure the angular distribution of particles emanating from the surface. Those particles having the smallest angle from the incident beam impact on the top secondary emitting surface while those particles with larger angles impact on other secondary emitting surfaces of the stacked plates in the electron multiplier.

In some embodiments of the invention, the resistivity of the plates can be varied radially in order to affect the electric field. Further embodiments may radially adjust the separation between plates, causing the secondary electron emitting surfaces to be, for example, conically or terraced shaped. Further, the electric field may be tilted (i.e., have components perpendicular to the radial direction) by adjusting the voltages supplied to the various electrodes and the bias voltage of the annular collector and tilt of the annular collector.

These embodiments, along with others, are further discussed below with reference to the following figures.

BRIEF DESCRIPTION OF THE FIGURES

FIGS. 3a and 3b show top and bottom planar views of an electron multiplier according to the present invention.

FIGS. 4a and 4b show top and bottom planar views of an electron multiplier according to the present invention constructed on a glass substrate.

DETAILED DESCRIPTION

Figure 1:
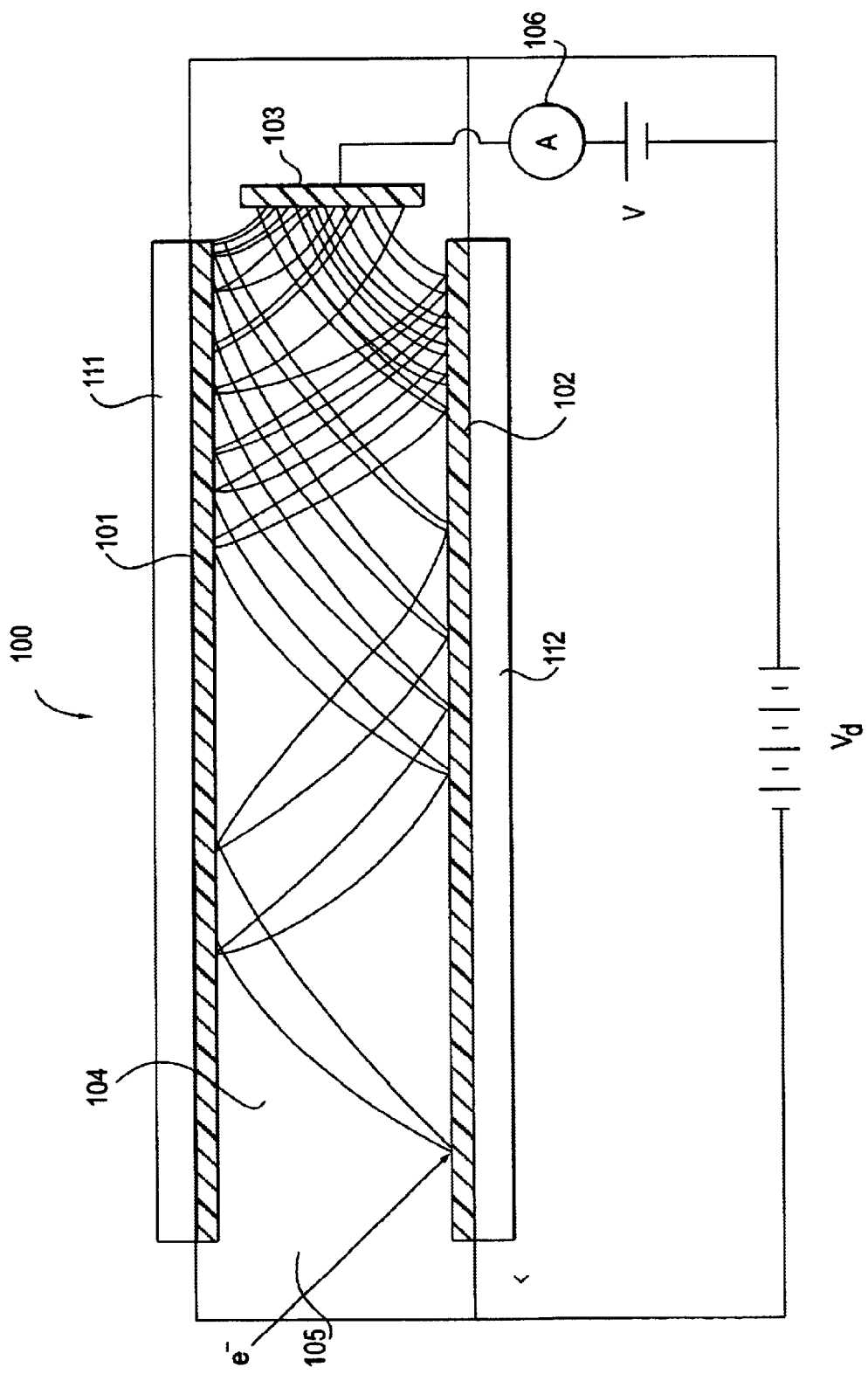
FIG. 1 shows a cross-sectional diagram of an electron multiplier.
Figure 2A:
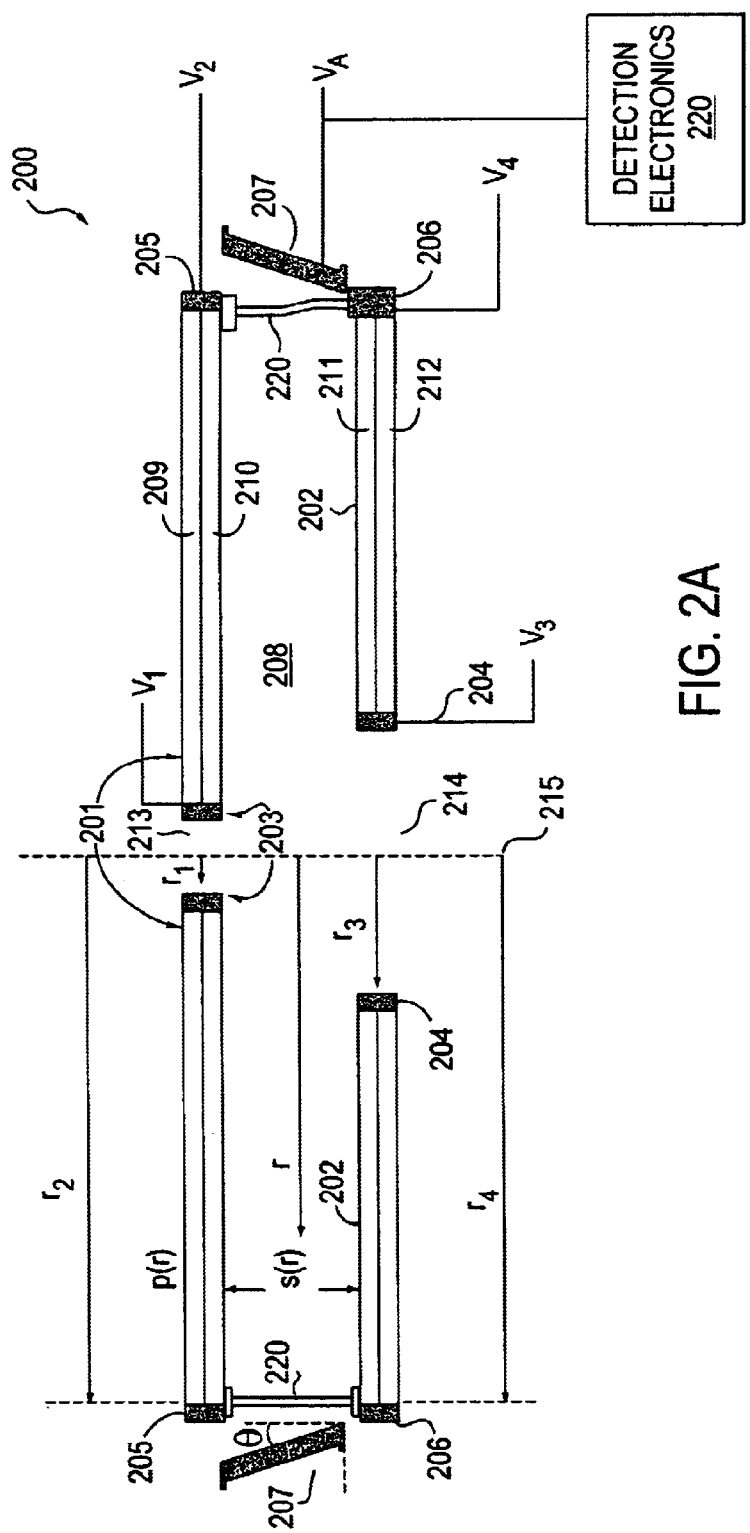
FIG. 2a shows a cross-sectional diagram of an electron multiplier according to the present invention.

FIG. 2a shows a cross-sectional view of an electron multiplier 200 according to the present invention. Electron multiplier 200 includes a top plate 201 having an access 213 with an inside radius $r_1$ and having an outside radius $r_2$, a bottom plate 202 having an access 214 with an inside radius $r_3$ and having an outside radius $r_4$. Top plate 201 and bottom plate 202 are separated by a distance s, forming a separation space 208, and arranged such that access 213 is aligned with access 214.

An electrode 203 is located around access 213 of top plate 201 and an electrode 205 is located along the outside radius of top plate 201. An electrode 204 is located around access 214 of electron emitter 202 and electrode 206 is located around the outside radius of electron emitter 202. Collector 207 is positioned around electron multiplier 200 at a radius about that of electrodes 205 and 206. A line 215, which defines the path of an incident beam through electron multiplier 200, passes through both access 213 and 214.

In some embodiments of the invention, the separation between top plate 201 and bottom plate 202, s(r), varies as a function of radius from line 215. In those embodiments, plates 201 and 202 can, for example, be conically shaped or terraced. Further, in some embodiments, the resistivity $\rho(r)$ of plates 201 and 202 may vary as a function of radius. Also, in some embodiments collector 207 may be "tilted" at an angle $\theta$ with respect to a normal to a plane of electron multiplier 200, providing a component of the electric field that is perpendicular to the radial direction in multiplier 200.

Additionally, the separation s can be maintained with spacers 220 that are placed to hold plates 201 and 202 apart. In some embodiments, collector 207 forms a portion of spacer 220.

The inside walls and outside walls of top plate 201 and bottom plate 202 need not be circular. They can be of any shape and are described as circular here for demonstrative purposes only. One skilled in the art will recognize that other geometries (e.g., square or elliptical) are within the scope and spirit of this disclosure.

FIG. 3a shows a plan view of the top of electron multiplier 200. Top plate 201 in the embodiment shown in FIG. 3a is an annular surface having access 213 with inner radius $r_1$ and having outer radius $r_2$. Electrode 203 is coupled to top plate 201 at radius $r_1$ around access 213 and electrode 205 is coupled around top plate 201 at radius $r_2$. Collector 20 electrode 207 is arranged around top plate 201 in order to collect the output burst of electrons from electron multiplier 200. In some embodiments, top plate 201 may extend beyond collector 207 so that collector 207 functions as part of spacer 220 (FIG. 2a) or spacer 220 may be inserted outside the radius of collector 207.

FIG. 3b shows a plan view of the bottom of electron multiplier 200. Bottom plate 203 in FIG. 3a is an annular surface having access 214 with inner radius $r_3$ and having outer radius $r_4$. In most embodiments, outer radius $r_2$ of top electron emitter 201 is about $r_4$. In some embodiments inner radius $r_1$ of access 213 is less than that of access 214, $r_3$. Therefore, FIG. 3b also shows top plate 201 and electrode 203. Electrode 204 is coupled to bottom plate 202 at radius $r_3$ and electrode 206 is coupled to bottom plate 202 at radius $r_4$.

Plates 201 and 202 (FIG. 2a) each have a secondary electron emitting surface, surfaces 210 and 211 respectively, capable of emitting one or more electrons when impacted with particles of sufficient energy. Each of plates 201 and 202 also provides structural support for electron multiplier 200. Further, plates 201 and 202 are conducting so that current can flow through plates 201 and 202.

Figure 2B:
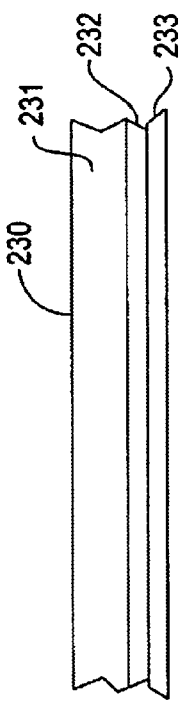
FIG. 2b shows a cross-sectional diagram of a plate utilized in an electron multiplier as shown in FIG. 2A.

FIG. 2b shows a portion of a plate 230 such as top plate 201 or bottom plate 202. Plate 230 includes structural portion 231, a resistive portion 232, and a secondary electron emitting surface 233. Plate 230 is oriented in electron multiplier 200 such that secondary emitting surface 233 is on the inside. For example, in FIG. 2a, top plate 201 includes structural portion 209 and secondary emitting surfaces 210; bottom plate 202 includes structural portion 212 and secondary emitting surface 211.

In some embodiments, plate 230 may be a single material that include structural portion 231, resistive portion 232, and secondary emitting surface 233. For example, plate 230 may be lead oxide glass, bismuth oxide glass, or iron borate glass. In some embodiments, plate 230 may include separate layers for one or more of structural portion 231, resistive portion 232, and secondary electron emitting surface 233. For example, secondary electron emitting surface 233 may be a diamond layer or an alkali halide layer. Resistive portion 232 may be a metal layer or a low resistivity semiconducting material (such as Si) or an insulating high resistivity material (such as Silicon Nitride).

In one embodiment, separation space 208 may be filled with glass spheres. The glass spheres may be, for example, of lead oxide glass, bismuth oxide glass, or iron borate glass. The glass spheres, then, provide secondary electron emitting surface 233 and spacer 220 (FIG. 2a). One advantage of having secondary electron emitting surface 210 and 211 in FIG. 2a being glass spheres is that ion feedback can be reduced.

A radial electric field is created within electron multiplier 200 by applying voltages at electrodes 203, 205, 204 and 206: A voltage $V_1$ is applied to electrode 203; a voltage $V_2$ is applied to electrode 205; a voltage $V_3$ is applied to electrode 204; and a voltage $V_4$ is applied to electrode 206. An anode voltage $V_A$ is applied to collector 207.

Many embodiments of electron multiplier 200 include two annular plates 201 and 202 separated by a small distances. The two annular plate 201 and 202 have similar outer diameters but different inner diameters at access 213 and 214, respectively. Annular plate 202, having a larger inner diameter than annular plate 201, is arranged to be closer to the source of particles to be detected. In operation, the particles to be detected will pass through access 214 of annular plate 202 and a significant number of them strike the secondary electron emitting surface of top plate 201. If the particle is of sufficient energy, multiple secondary electrons may be emitted by secondary electron emitter 201 as a result of the particle's impact.

Voltage $V_2$ is greater than voltage $V_1$ and voltage $V_4$ is greater than voltage $V_3$, creating electric fields having radial components. Electrons are multiplied as they collide with the secondary electron emitting surfaces of plates 201 and 202 and are accelerated radially toward collector 207. Collector 207 is biased with a voltage $V_A$ that is greater than the voltages $V_2$ and $V_4$ so that it attracts electrons. Detection electronics 220 detects bursts of electrons at collector 207.

The annular geometry of embodiments of electron multiplier 200 is highly suited for detection of secondary and back-scattered electrons in, for example, a scanning electron microscope or e-beam lithography tool. Specifically, detector 200 can be a thin package with an input area arbitrarily close to an input beam along line 215. The thickness of multiplier 200 reduces the column length occupied by the detector. This reduction in thickness is particularly important in micro-columns, in columns where electron multiplier 200 is placed between deflectors and the final lens, and in systems with an external electron multiplier 200 where a short working distance is desired. Moving the entrance of the detector close to the optic axis facilitates detection of secondary and back-scattered electrons that are inherently close to the axis or that have been collimated by a lens or an extraction field. In some embodiments, collector 207 is segmented and discrete electronics 220 is provided for each segment, facilitating the measurement of the azimuthal distribution of the incoming particles. In some embodiments, electron multiplier 200 may be completely segmented (i.e., secondary electron emitting surfaces of plates 201 and 202 may be segmented) in order to improve the measurement of the azimuthal distribution of the incoming particles.

Additionally, unlike channeltrons or other parallel plate multipliers, the resistance, size, shape and spacing of plates 201 and 202 may be easily changed, allowing for optimization of multiplier gain, maximum output current and bandwidth.

The annular geometry of this embodiment of electron multiplier 200 also yields other inherent advantages. Assuming a uniform resistivity of plates 201 and 202, the resistance per unit of radial distance will be higher near line 215 and lower at the outer radius. Therefore, there will be a stronger electric field near the incident beam, resulting in the gain being larger during the earlier stages of multiplication. High gain at the early stages of multiplication is important for lowering the statistical contributions to the signal to noise ratio. As the pulse propagates radially outward, the field will decrease, and the charge will spread more in the azimuthal direction, decreasing the charge density and delaying the onset of saturation effects. If plates 201 and 202 are fabricated using a thin film emitter material (dynode) and an insulator (support portion 231 in FIG. 2b), the film thickness could be varied to further optimize the electric field. The dynodes, which may include resistive portion 232 and secondary electron emitting surface 233 (FIG. 2b), can then be patterned to make discrete sectors that might confine the current pulses, resulting in more accurate measurements of the azimuthal distribution.

The gain of electron multiplier 200 can be optimized by adjusting the outer radiuses of the secondary electron emitting surfaces of plates 201 and 202. Additionally, the separation between plates 201 and 202 s(r) can be varied to compensate for the radial field dependence. Plates 201 and 202 can, for example, then be conical in shape or terraced. Also, the radial resistance ρ(r) of each of electron emitters 201 and 202 can be varied to provide a more uniform radial electric field. Additionally, the electric field can be tilted at an angle with respect to plates 201 and 202 to achieve the same gain one would achieve with an optimum plate separation. This tilt may be varied in the radial direction with independent biasing of the four electrodes 201, 205, 204 and 206. Tilting collector 207 at an angle can also contribute normal components of the electric field.

In one particular embodiment, $r_1$ is about 0.68, $r_2$ is about 2.5 mm, s(r) is about 0.60 mm, $r_3$ is about 1.25 mm, and $r_4$ is about 2.5 mm. With $V_4$ about 0 V, $V_2$ about 2000V, $V_3$ about 0 V, and $V_4$ 2000V electron multiplier 200 has a gain of about 2100.

Figure 4C:
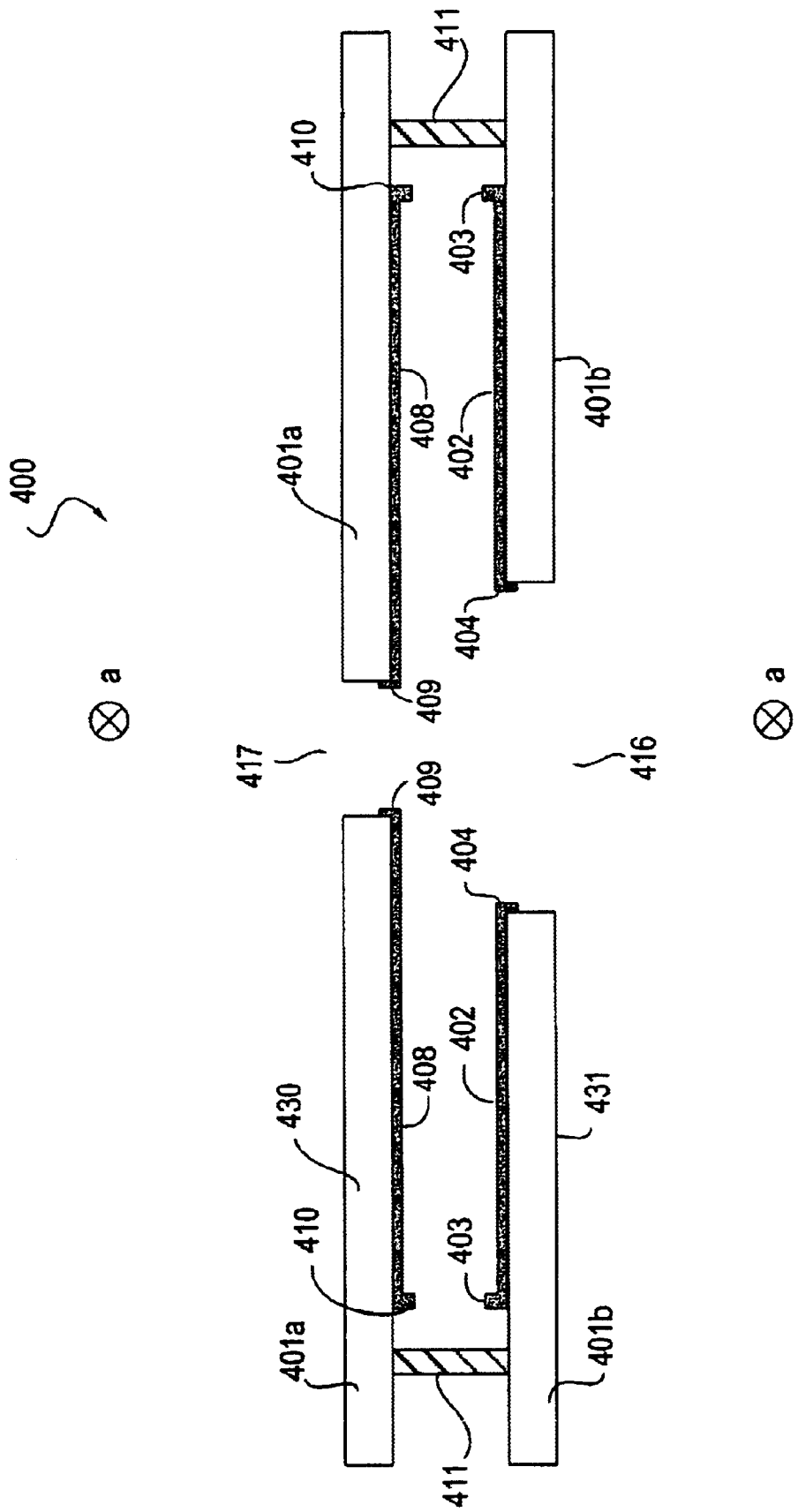
FIG. 4c shows a cross-sectional view of the electron multiplier shown in FIGS. 4a and 4b.

FIGS. 4a and 4b show bottom and top planar views, respectively, of an electron multiplier 400 according to the present invention. FIG. 4c shows a cross-sectional view of election multiplier 400 along direction a as indicated in FIGS. 4a, 4b, and 4c. Electron multiplier 400 includes plate 401a having secondary electron emitting surface 402 (FIG. 4a) and plate 401b having secondary electron emitting surface 408 (FIG. 4b).

In FIGS. 4a and 4c, plate 401b and secondary electron emitting surface 402 has an access 416 with an inner radius that is larger than that of access 417 of plate 401a and secondary electron emitting surface 408. Electrode 404, which is coupled to the inside radius of secondary electron emitting surface 402, is electrically coupled to a pad 405. Voltage $V_3$ can be applied to electrode 404 through pad 405. Access 407, in FIG. 4a a small pie-shaped area where secondary electron emitting surface 402 is not deposited, provides the ability to electrically couple electrode 404 with pad 405. Electrode 403 is coupled around the outer radius of electron emitting surface 402 and is electrically coupled to pad 406. A voltage $V_4$ can be applied to electrode 403 through pad 406.

In FIGS. 4b and 4c, secondary electron emitting surface 408, and plate 401a, has an access 417 with an inner radius that is smaller than that of secondary electron emitter 402. Additionally, secondary electron emitting surface 408 and secondary electron emitting surface 402 are arranged coincidentally so that their centers are at the same position, providing access to an incident beam traveling through electron multiplier 400 normal to the surface of plates 401a and 401b.

In most embodiments, access 407 also aligns with access 413. Electrode 409 is coupled along the inside radius of electron emitting surface 408 and is electrically coupled to a pad 415 through access 413. A voltage $V_1$ can be applied to electrode 409 through pad 415. Electrode 410 is coupled around the outside radius of electron emitting surface 408 and is electrically coupled to pad 414. A voltage $V_2$ can be applied to electrode 410 through pad 414.

Collector 411 is arranged around the outside of electron emitting surface 408 and 402 and is electrically coupled to pad 412. A bias voltage can be applied to collector 411 through pad 412. Furthermore, burst signals indicating detection of particles is measured by detection electronics at pad 412. Furthermore, as is shown in FIG. 4c, collector 411 can also provide spacing between plates 401a and 401b.

The embodiment shown in FIGS. 4a, 4b, and 4c can be fabricated using micromachining techniques. Electrodes such as electrodes 404, 403, 409, 410 and collector 411, interconnects, resistive layers secondary emitting surfaces 402 and 408 of plates 401a and 401b, respectively, can be patterned lithographically on insulating substrates.

Plates 401a and 401b include a substrate 430 and 431, respectively, which can be an insulator. Secondary electron emitting surfaces 402 and 408 are then deposited on substrates 430 and 431, respectively. Electron emitting surfaces 402 and 408 may include a resistive layer and a secondary electron emitting layer or the resistive layer may also serve as a secondary emitting layer.

Figures 5A, 5B:
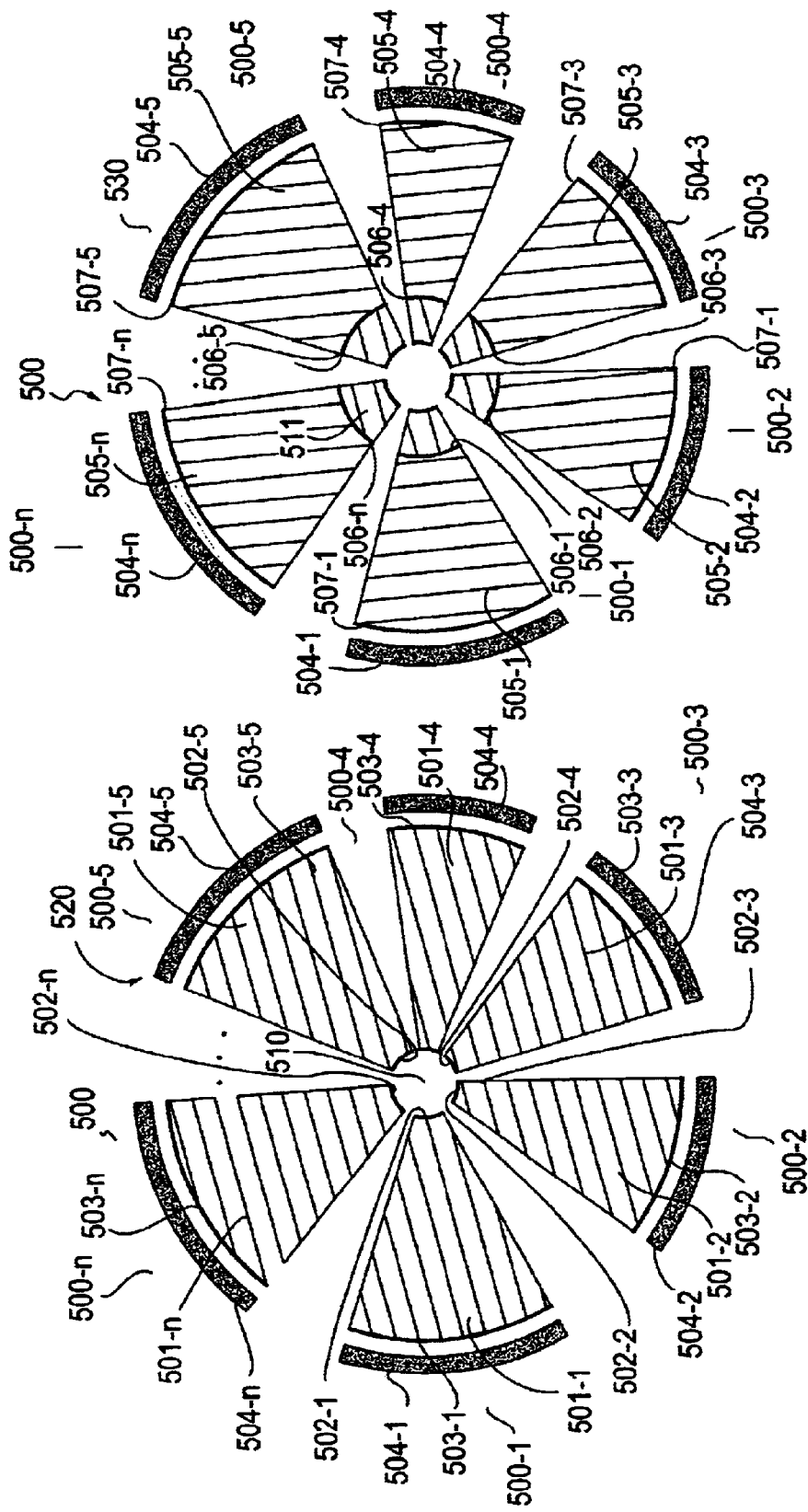
FIGS. 5a and 5b each shows a plan view of another embodiment of an electron multiplier having a segmented collector electrode.

FIGS. 5a and 5b show planar views, respectively, of another electron multiplier 500 according to the present invention. Electron multiplier 500 includes a collector 504 having N collector segments 504-1 through 504-N. Electron multiplier 500 further includes a secondary electron emitting surface 501 (FIG. 5a) having an access 510 with an inner radius and having an outer radius. Electrode 502 is arranged around the inner radius of secondary electron emitting surface 501. Electrode 503 is arranged around the outer radius of secondary electron emitting surface 501. Secondary electron emitting surface has an access 511 with inner radius and an outer radius. Electrode 506 is arranged around the inside of secondary electron emitting surface 505, and electrode 507 is arranged around the outside of secondary electron emitting surface 505. As has been previously described, secondary electron emitting surfaces 501 and 505 are separated by a small separation, which may vary as a function of radius. Secondary electron emitting surfaces 501 and 505 are portions of plates 520 and 530, respectively, as has been previously discussed, plates 520 and 530 include a structural portion and resistive portion as well as secondary emitting surfaces 501 and 505.

Collector 504 is segmented into collector segments 504-1 through 504-N in order to allow measurements of the azimuthal distribution of particles entering electron multiplier 500. Each of collector segments 504-1 through 504-N can be separately biased and monitored by detection electronics. Measurement of an electron burst on one of collector segments 504-1 through 504-N, then, is indicative of a particle entering electron multiplier 500 in a direction toward that one of collector segments 504-1 through 504-N. The number of collector segments N can be as large as needed to yield a desired resolution for measurements of the azimuthal distribution of incoming particles.

In addition to collector 504 being segmented, electron multiplier 500 may be completely segmented into segments 500-1 through 500-N. Segmenting electron multiplier 500, for example, will reduce cross-talk between segments and improve the precision of the azimuthal distribution measurements. Further, segmenting electron multiplier 500 allows for independent control over each of segments 500-1 through 500-N.

Each of segments 500-1 through 500-N is arranged to include a corresponding one of collector segments 504-1 through 504-N, respectively. In FIG. 5a, secondary electron emitting surface 501 includes electron emitting surface 501-1 through 501-N aligned with collector segments 504-1 through 504-N. Electrode 502 is arranged around the inner radius of secondary electron emitting surface 501. A separate voltage can be applied to each segment of electrode 502, electrodes 502-1 through 502-N. Electrode 503 is arranged along the outer radius of electron emitting surface 501. A separate voltage can also be applied to each electrode segment 503-1 through 503-2 of electron emitter 503.

FIG. 5b shows a corresponding planar view of a bottom portion of electron multiplier 500. Secondary electron emitting surface 505 includes secondary electron emitting surface segments 505-1 through 505-N. Secondary electron emitting surface segments 505-1 through 505-N are arranged such that electron emitting surface segment 505-1 is directly below, and separated from, electron emitting surface segment 501-1 of FIG. 5a. Electrodes 506-1 through 506-N are arranged along the inner radius of secondary electron emitting surfaces 505-1 through 505-N, respectively. Additionally, electrodes 507-1 through 507-N are arranged along the inner radius of secondary electron emitting surfaces 505-1 through 505-N, respectively.

Therefore, electron multiplier segment 500-j, an arbitrary one of electron multiplier segments 500-1 through 500-N, includes secondary electron emitting surface 501-j and secondary electron emitting surface 505-j directly beneath secondary electron emitting surface 501-j. Electrodes 502-j and 503-j are arranged along the inside and outside respectively, of secondary electron emitting surface 501-j. Electrodes 506-j and 507-j are arranged along the inside and outside respectively, of secondary electron emitting surface 505-j. Electron multiplier segment 500-j is aligned with collector segment 504-j. Electrons entering electron multiplier segment 500-j are accelerated radially towards collector segment 504-j. Each collision with one of secondary electron emitting surfaces 501-j or 505-j results in a multiplication of electrons so that collector segment 504-j can receive a pulse of electrons in response to the incoming electron.

Figure 6:
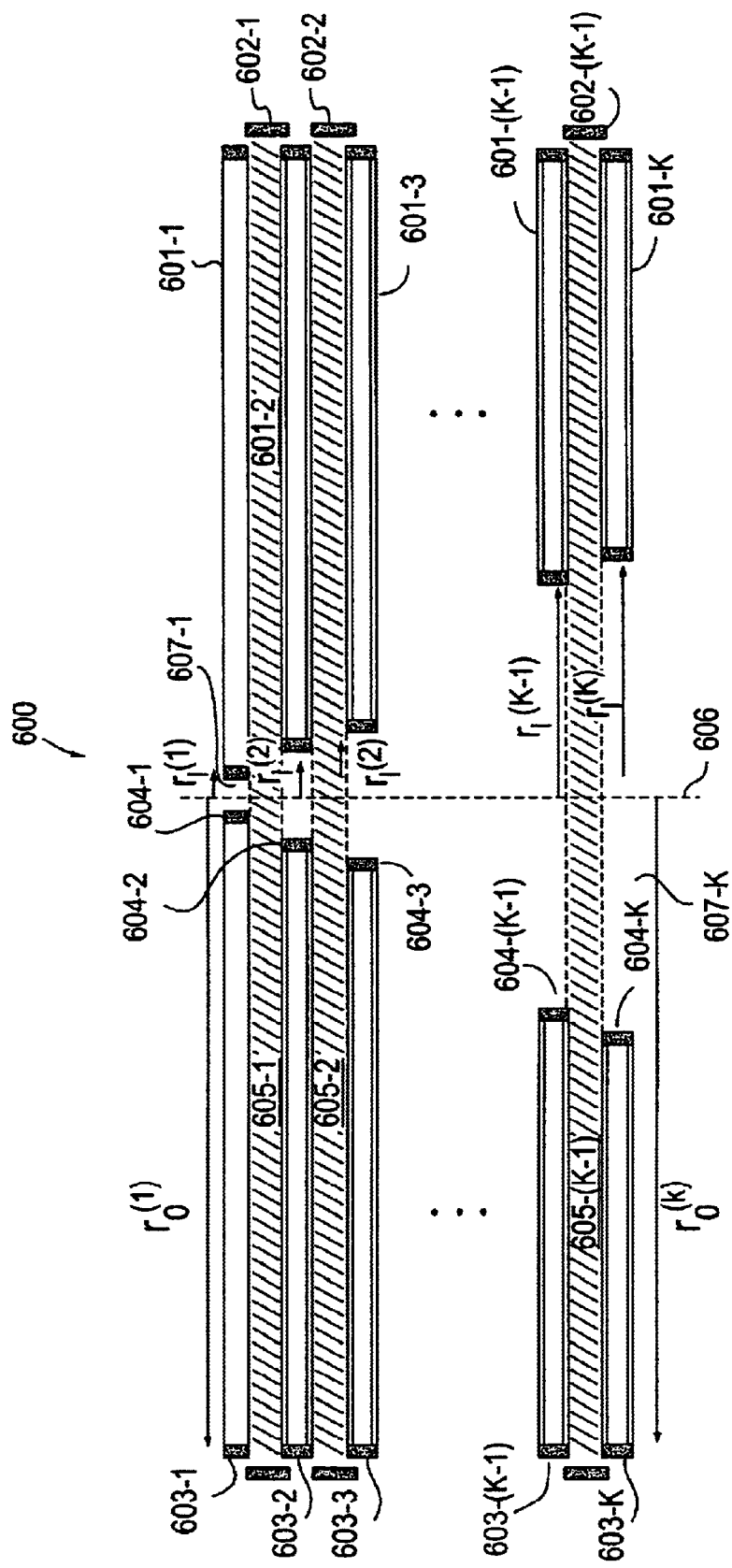
FIG. 6 shows a cross-sectional diagram of a stacked electron multiplier according to the present invention.

FIG. 6 shows a cross-sectional view of a stacked electron multiplier 600. Electron multiplier 600 includes plates 601-1 through 601-K. Each of plates 601-1 through 601-K has an access 607-1 through 607-K with inner radius $r_I^{(1)}$ through $r_I^{(K)}$, respectively. Further, each of plates 601-1 through 601-K has an outer radius $r_o^{(1)}$ through $r_o^{(K)}$, respectively. Plates 601-1 through 601-K may each include resistive portions, structural portions, as well as a secondary electron emitting surfaces. In FIG. 6, each of electron emitters 601-2 through 601-(K-1) include structural and resistive portions sandwiched between two secondary electron emitting surfaces. Additionally, in some embodiments the resistivity of each of plates 601-1 through 601-K may vary as a function of radial distance from a common line 606.

Plates 601-1 through 601-K are stacked such that the centers of access 607-1 through 607-K lie along common line 606. In most cases, common line 606 is normal to the surfaces of plates 601-1 through 601-K. In many embodiments, plates 601-1 through 601-K are stacked in order of increasing radius such that $r_I^{(1)}$ is the smallest radius and $r_I^{(K)}$ is the largest radius (i.e., $r_I^{(1)} < r_I^{(2)} < \cdots < r_I^{(K)}$). Further, in many embodiments the outer radii of plates 601-1 through 601-K are substantially the same (i.e., $r_o^{(1)} \approx r_o^{(2)} \approx \cdots \approx r_o^{(K)}$).

Plates 601-1 through 601-K are separated by a small distance, which may not be the same for each sequential pair of plates 601-1 through 601-K. Further, the separation between pairs of plates 601-1 through 601-K may vary as a function of radius from common line 606. The separation between adjacent plates forms a spacing 605-1 through 605-(K1). Plates 601-1 through 601-K in many embodiments are structurally separated by spacers (not shown), which may include collectors 602-1 through 602-(K-1).

Collectors 602-1 through 602-(K-1) are arranged to collect bursts of electrons from between each sequential pair of plates. For example, collector 602-1 is arranged in spacing 605-1. Further, electrodes 604-1 through 604-K are arranged around the inside radius of the secondary electron emitting surfaces of plates 601-1 through 601-K, respectively, and electrodes 603-1 through 603-K are arranged around the outside of the secondary electron emitting surfaces of plates 601-1 through 601-K, respectively. Radial electric fields for accelerating electrons towards each of collectors 602-1 through 602-(K-1) are arranged by applying the appropriate voltages to electrodes 603-1 through 603-K and 604-1 through 604-K.

By stacking plates to form electron multiplier stacks (e.g., the combination of plates 601-1 and 601-2 forms an electron multiplier; the combination of plates 601-2 and 601-3 forms an electron multiplier, as does any consecutive pair of plates 601-1 through 601-K), the angle of a particle emitted from a surface relative to the incident beam can be measured. In most embodiments, the incident beam is along common line 606 and propagates from plates 601-1 through 601-K. The stacked electron multiplier 600 can also be segmented, as described for embodiments of electron multiplier 500 of FIGS. 5a and 5b, to further measure the azimuthal distribution of particles reflected from a surface impacted by the incident beam.

Figure 7:
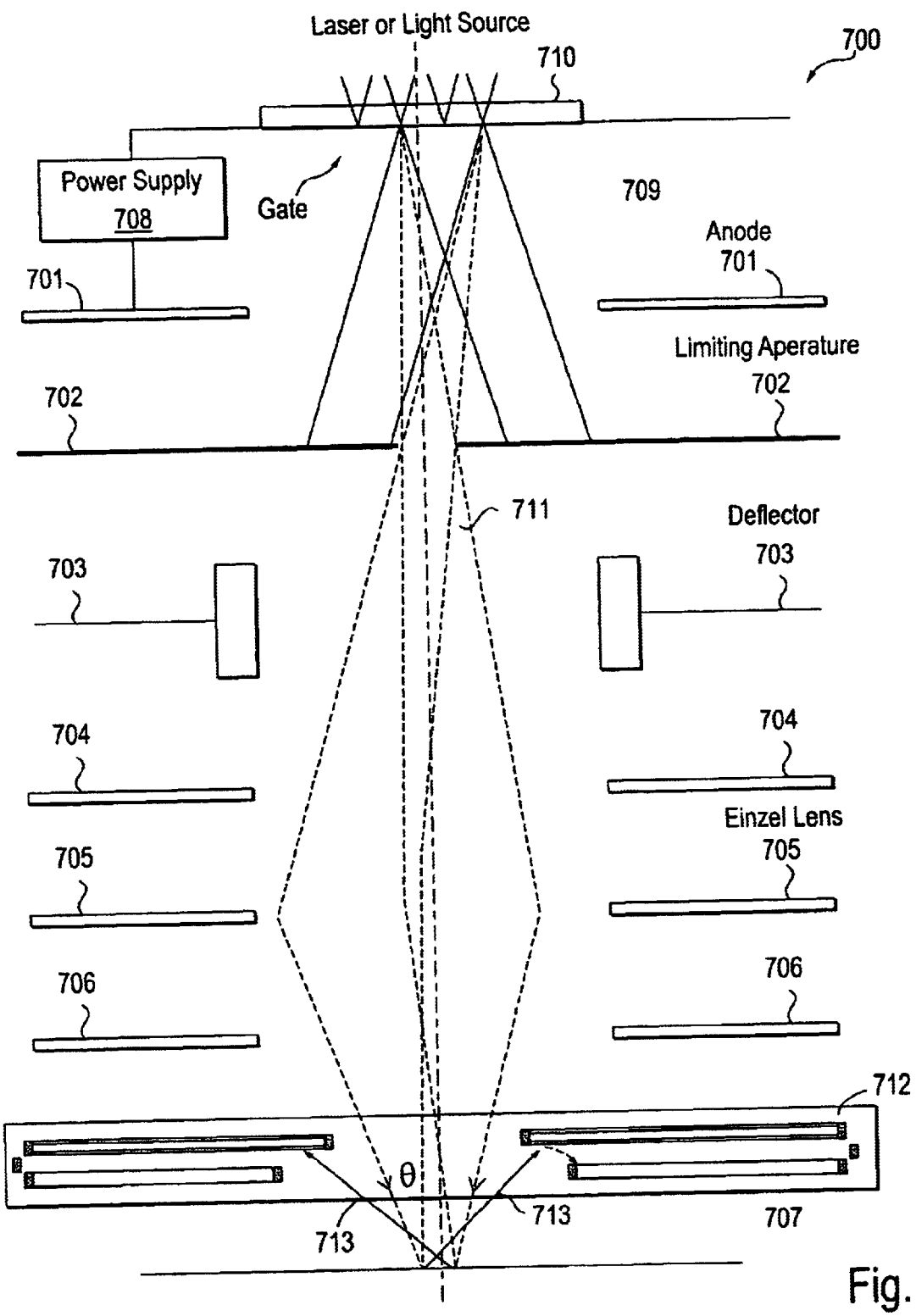
FIG. 7 shows a cross-section view of an electron microcolumn having an electron multiplier according to the present invention.

FIG. 7 shows in a cross-sectional view an electron multiplier 712 according to this invention mounted within a micro-column 700. Micro-column 700 is contained within an evacuated chamber (not shown). The substrate of photocathode 710 may suffice as a vacuum window allowing a laser light source onto the irradiation regions of photocathode 710 or alternatively photocathode 710 may be fully enclosed in the vacuum chamber. Electron beams 711 are emitted from the emission region of photocathode 710 and are accelerated through anode 701. Anode 701 is held at a voltage of from one kilovolt to several tens of kilovolts over that of the photoemitters in photocathode 710. Limiting aperture 702 blocks a portion of beams 711 which have a larger emission solid angle than desired. Deflector 703 allows the image of the emission regions contained in electron beams 711 to be laterally shifted. Einzel lens, having electrodes 704, 705, and 706, focuses and demagnifies the image onto target 707. Target 707 may be any surface impacted by electron beam 711, including either a semiconductor wafer or a mask blank for electron beam lithography.

Beam 713 is reflected or emitted from target 707 in response to electron beam 711. Electron multiplier 712 passes electron beam 711 to target 707 and, as has been described above with relation to FIGS. 2 through 6, captures particles from beam 713. Electron multiplier 712 may be segmented as is described with FIGS. 5a and 5b, in which case the azimuthal distribution of radiation emitted from surface 707 can be measured. Further, electron multiplier 712 may be stacked as in FIG. 6, in which case the angular distribution from incident beam 711 can be measured. Further, electron multiplier 712 may be placed at any position along microcolumn 700.

The above described examples are demonstrative only. Variations that are obvious to one skilled in the art fall within the scope of this invention. As such, this application is limited only by the following claims.

We claim:

1. An electron multiplier, comprising:
   a top plate having a top beam access and a secondary electron emitting surface;
   a bottom plate having a bottom beam access and a secondary electron emitting surface, the secondary electron emitting surface of the bottom plate being adjacent to and separated from the secondary electron emitting surface of the top plate;
   wherein the top beam access and the bottom beam access enable an incident beam to pass through the electron multiplier; and
   a collector electrode positioned around the top plate and the bottom plate so as to detect electrons emerging from between the top plate and the bottom plate;
   wherein the collector electrode includes a plurality of segments, each of the plurality of segments detecting electrons from a particular range of azimuthal angles; and
   wherein the secondary electron emitting surface of the top plate and the secondary electron emitting surface of the bottom plate each include a plurality of secondary electron emitting surfaces that are segmented and wherein the segments are positioned to correspond with the plurality of segments of the collector electrode.

2. An electron multiplier, comprising:
   a top plate having a top beam access and a secondary electron emitting surface;
   a bottom plate having a bottom beam access and a secondary electron emitting surface, the secondary electron emitting surface of the bottom plate being adjacent to and separated from the secondary electron emitting surface of the top plate;
   wherein the top beam access and the bottom beam access enable an incident beam to pass through the electron multiplier; and
   a collector electrode positioned around the top plate and the bottom plate so as to detect electrons emerging from between the top plate and the bottom plate;
   wherein a separation between the top plate and the bottom plate varies as a function of distance from a center line so that a cross section through the top plate and the bottom plate is cone shaped or terraced; and
   wherein the collector electrode has a cross section taken with a plane normal to a plane of the electron multiplier which is a straight line, which straight line is tilted at an angle with respect to a normal to a plane of the electron multiplier.

3. An electron multiplier, comprising:
   a top plate having a top beam access and a secondary electron emitting surface;
   a bottom plate having a bottom beam access and a secondary electron emitting surface, the secondary electron emitting surface of the bottom plate being adjacent to and separated from the secondary electron emitting surface of the top plate;
   wherein the top beam access and the bottom beam access enable an incident beam to pass through the electron multiplier; and
   wherein a resistance of the top plate and the bottom plate varies as a function of distance from a center line so as to provide a more uniform radial electric field.

4. An electron multiplier, comprising:
   a top plate having a top beam access and a secondary electron emitting surface;
   a bottom plate having a bottom beam access and a secondary electron emitting surface, the secondary electron emitting surface of the bottom plate being adjacent to and separated from the secondary electron emitting surface of the top plate;
   wherein the top beam access and the bottom beam access enable an incident beam to pass through the electron multiplier; and
   wherein at least one middle plate is positioned between the top plate and the bottom plate, each of the at least one middle plates having a beam access which is aligned with the top beam access and the bottom beam access, and each of the at least one middle plates having a top secondary electron emitting surface and a bottom secondary electron emitting surface.

5. The multiplier of claim 4, wherein a plurality of collector electrodes are positioned between the top plate, the bottom plate, and the at least one middle plate to detect bursts of electrons emerging between successive plates of the top plate, the bottom plate, and the at least one middle plate.

6. A method of detecting particles comprising:
   providing a top secondary electron emitting surface separated from a bottom secondary electron emitting surface;
   providing a beam access through the top secondary electron emitting surface and the bottom secondary electron emitting surface;
   providing an electric field radially outward from a center of the beam access;
   capturing the particles into a region between the top secondary electron emitting surface and the bottom secondary electron emitting surface at the beam access;
   emitting electrons each time one of the particles or an electron impacts one of the top secondary electron emitting surface or the bottom secondary electron emitting surface, the electrons being accelerated radially by the electric field; and
   detecting a resultant burst of electrons from between the top secondary electron emitting surface and the bottom secondary electron emitting surface;
   wherein a plurality of secondary electron emitting surfaces is positioned between the top secondary electron emitting surface and the bottom secondary electron emitting surface, and detecting the resultant burst of electrons comprises detecting a burst of electrons from between successive ones of the top secondary electron emitting surface, the plurality of secondary electron emitting surface, and the bottom secondary electron emitting surface, thereby measuring the angular distribution of the particles.

7. An electron multiplier that comprises:
   a top plate having a top beam access and a secondary electron emitting surface;
   a bottom plate having a bottom beam access and a secondary electron emitting surface, the secondary electron emitting surface of the bottom plate being adjacent to and separated from the secondary electron emitting surface of the top plate;
   wherein the top beam access and the bottom beam access enable an incident beam to pass through the electron multiplier; and a collector electrode positioned around the top plate and the bottom plate so as to detect electrons emerging from between the top plate and the bottom plate;

wherein one or more of the top plate or bottom plate comprises one or more of lead oxide glass, bismuth oxide glass, or iron borate glass.

8. A stacked electron multiplier that comprises:

a top plate, a bottom plate, and a multiplicity of middles plates disposed between the top plate and the bottom plate;

wherein the top plate, the bottom plate, and each of the middle plates has an access with an inner radius;

wherein each of the middle plates include two secondary electron emitting surfaces disposed on opposite sides thereof and wherein the top plate and the bottom plate include a secondary electron emitting surface disposed on a surface thereof;

the top plate, the bottom plate, and the middle plates being stacked so that a center of access thereof lie along a common line, and so that each sequential pair of plates is separated by a pair distance.

9. The stacked electron multiplier of claim 8 wherein the top plate, the bottom plate, and the middle plates are stacked in order of increasing inner radius wherein the middle plate having the smallest inner radius is disposed directly apart from the top plate and the middle plate having the largest inner radius is disposed directly apart from the bottom plate.

10. The stacked electron multiplier of claim 8 wherein the pair distance is not the same for each sequential pair of plates.

11. The stacked electron multiplier of claim 8 wherein the pair distance for one or more of the sequential pairs of plates is a function of distance from the common line.

12. The stacked electron multiplier of claim 8 wherein a resistivity of the middle plates vary as a function of distance from the common line.

13. The stacked electron multiplier of claim 8 which further comprises a multiplicity of collector electrodes arranged to collect bursts of electrons from between each sequential pair of plates.

14. The stacked electron multiplier of claim 12 wherein at least one of the collector electrodes includes a plurality of segments; and the secondary electron emitting surfaces of the sequential pair of plates providing electrons to the at least one of the collector electrodes each include a plurality of secondary electron emitting surfaces positioned to correspond with the plurality of segments of the at least one of the collector electrodes.

15. An electron micro-column that comprises:

a cathode, the cathode being capable of generating a beam of electrons;

beam shaping electronics, the beam shaping electronics capable of shaping a focusing the beam of electrons; and a stacked electron multiplier detector positioned above a target surface, the beam of electrons passing through a beam access in the stacked electron multiplier detector and impacting with the surface, the stacked electron multiplier being disposed to detect particles emitted from the surface; wherein the stacked electron multiplier comprises:

a top plate, a bottom plate, and a multiplicity of middles plates disposed between the top plate and the bottom plate;

wherein the top plate, the bottom plate, and each of the middle plates has an access with an inner radius;

wherein each of the middle plates include two secondary electron emitting surfaces disposed on opposite sides thereof and wherein the top plate and the bottom plate include a secondary electron emitting surface disposed on a surface thereof;

the top plate, the bottom plate, and the middle plates being stacked so that a center of access thereof lie along a common line, and so that each sequential pair of plates is separated by a pair distance;

wherein the top plate, the bottom plate, and the middle plates are stacked in order of increasing inner radius wherein the middle plate having the smallest inner radius is disposed directly apart from the top plate and the middle plate having the largest inner radius is disposed directly apart from the bottom plate.

16. The electron micro-column of claim 15 wherein the stacked electron multiplier further comprises a multiplicity of collector electrodes arranged to collect bursts of electrons from between each sequential pair of plates; and wherein at least one of the collector electrodes includes a plurality of segments; and the secondary electron emitting surfaces of the sequential pair of plates providing electrons to the at least one of the collector electrodes each include a plurality of secondary electron emitting surfaces positioned to correspond with the plurality of segments of the at least one of the collector electrodes.

* * * * *